United States Patent
Wippler et al.

(10) Patent No.: US 8,113,472 B2
(45) Date of Patent: Feb. 14, 2012

(54) MOUNTING SYSTEM AND METHOD THEREOF

(75) Inventors: Erik A. Wippler, Canton, MI (US); Robert Anthony Porcs, Waterford, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 438 days.

(21) Appl. No.: 12/424,424

(22) Filed: Apr. 15, 2009

(65) Prior Publication Data

US 2010/0264276 A1   Oct. 21, 2010

(51) Int. Cl.
*G12B 9/00* (2006.01)
(52) U.S. Cl. .................. 248/27.1; 248/200; 248/201
(58) Field of Classification Search .................. 248/200, 248/201, 27.1, 27.3, 674, 675; 312/223.2
See application file for complete search history.

(56) References Cited

U.S. PATENT DOCUMENTS

| | | | |
|---|---|---|---|
| 4,447,030 A | 5/1984 | Nattel | |
| 4,742,978 A | 5/1988 | Ponticelli | |
| 5,104,071 A | 4/1992 | Kowalski | |
| 5,676,338 A | 10/1997 | Warda et al. | |
| 7,155,026 B2 | 12/2006 | Augustin, Sr. et al. | |
| 7,735,785 B2 * | 6/2010 | Wippler et al. | 248/27.1 |

FOREIGN PATENT DOCUMENTS

DE   3824301 A1   2/1990

* cited by examiner

*Primary Examiner* — Anita M King
(74) *Attorney, Agent, or Firm* — Gifford, Krass, Sprinkle, Anderson & Citkowski, P.C.

(57) ABSTRACT

A mounting system for temporarily holding a device proximate to a panel while an individual works on the device, before the device is mounted to the panel, is provided. The mounting system can include a generally L-shaped bracket that has a catch tab extending from a distal end of the bracket. A panel is also included, the panel having a key hole with a catch slot. The catch tab can be passed through the key hole and engage the catch slot, thereby providing a temporary mount for a device attached to the generally L-shaped bracket.

16 Claims, 3 Drawing Sheets

MOUNTING SYSTEM AND METHOD THEREOF

FIELD OF THE INVENTION

The present invention is related to a mounting system for temporarily holding a device proximate to a panel while an individual works on the device and before the device is mounted to the panel.

BACKGROUND OF THE INVENTION

The use of brackets, fixtures and the like for mounting devices to panels is known. For example, various types of brackets can be used to mount an electronic device to an instrument panel in a motor vehicle, an instrument panel on a stationary machine and the like. In some instances, a device must be held proximate to the panel in order that one or more components can be connected to the device before it is mounted to the panel.

In such instances, an individual has to hold the device in one hand while connecting the one or more components to the device with the other hand. In addition, in assembly line operations, the individual has a limited amount of time to connect the one or more components to the device before the device is mounted to the panel.

Although heretofore brackets have afforded for the device to be mounted to the panel, such brackets have not provided a temporary mounting system that holds the device proximate to the panel while it is worked on, after which it can be mounted to the panel. As such, a mounting system and method that provides a temporary mounting of the device proximate to the panel while it is worked on would be desirable.

SUMMARY OF THE INVENTION

A mounting system for temporarily holding a device proximate to a panel while an individual works on the device, before the device is mounted to the panel, is provided. In addition, a process for installing the device into the panel is provided. The mounting system can include a generally L-shaped bracket that has a first portion and a second portion extending from the first portion. The second portion has a predetermined thickness and a distal end spaced apart from the first portion. A catch tab can extend from the distal end at an angle, the catch tab having a length.

A panel can also be included, the panel having a key hole with a catch slot extending therefrom. The key hole has a width, and the catch slot has a width that is less than the key hole width. In addition, the thickness of the second portion of the generally L-shaped bracket is less than the width of the catch slot and the length of the catch tab is less than the key hole width but greater than the catch slot width. As such, the catch tab can engage a front side of the catch slot and temporarily hold the device proximate to the panel when the catch tab is passed through the key hole and the second portion is lowered into the catch slot such that the catch tab is located directly adjacent to the catch slot.

In some instances, the panel can have an anti-pivot rib of flange that extends from a generally vertical edge of the catch slot in a rearwardly direction. The anti-pivot rib can contact the second portion of the generally L-shaped bracket and prevent the bracket from pivoting beyond a predetermined angle when the second portion is located within the catch slot and the catch tab is engaged with the front side of the catch slot. In other instances, the panel can have two anti-pivot ribs or flanges extending in a rearwardly direction from opposing general vertical edges of the catch slot.

The second portion of the generally L-shaped bracket can have a reinforcement flange that extends along a bottom edge thereof, the reinforcement flange stiffening the second portion, contacting the anti-pivot rib and thereby reducing the predetermined angle that the L-shaped bracket can pivot when the second portion is located within the catch slot. The panel can be an instrument panel for a machine and in some instances is an instrument panel for a motor vehicle. The device can be an electronic device that is attached to the first portion and/or second portion of the generally L-shaped bracket, the electronic device temporarily held proximate to the panel while electrical wiring is attached thereto. Thereafter, the electrical device can be removed from the temporarily held position and mounted to the panel.

A process for installing the device can include providing the device, the device optionally having at least one connection and a component that can be connected thereto. The generally L-shaped bracket is naturally provided along with the panel. The panel can have a device-opening that is dimensioned for the device and the L-shaped bracket to fit at least partially therethrough. The panel also has the key hole with the catch slot.

The catch tab of the L-shaped bracket can be passed through the key hole and the second portion of the generally L-shaped bracket lowered into the catch slot such that the catch tab engages the front side of the catch slot and temporarily mounts the device to the panel proximate the opening. Thereafter, a component can be connected to the device while it is temporarily mounted to the panel. After the component has been connected, the second portion can be raised out of the catch slot and the catch tab passed back through the key hole such that the device is no longer temporarily mounted to the panel. The device can then be placed at least partially through the opening of the panel and rigidly attached thereto using the second portion and/or the first portion of the generally L-shaped bracket.

DETAILED DESCRIPTION OF THE INVENTION

Figure 1:
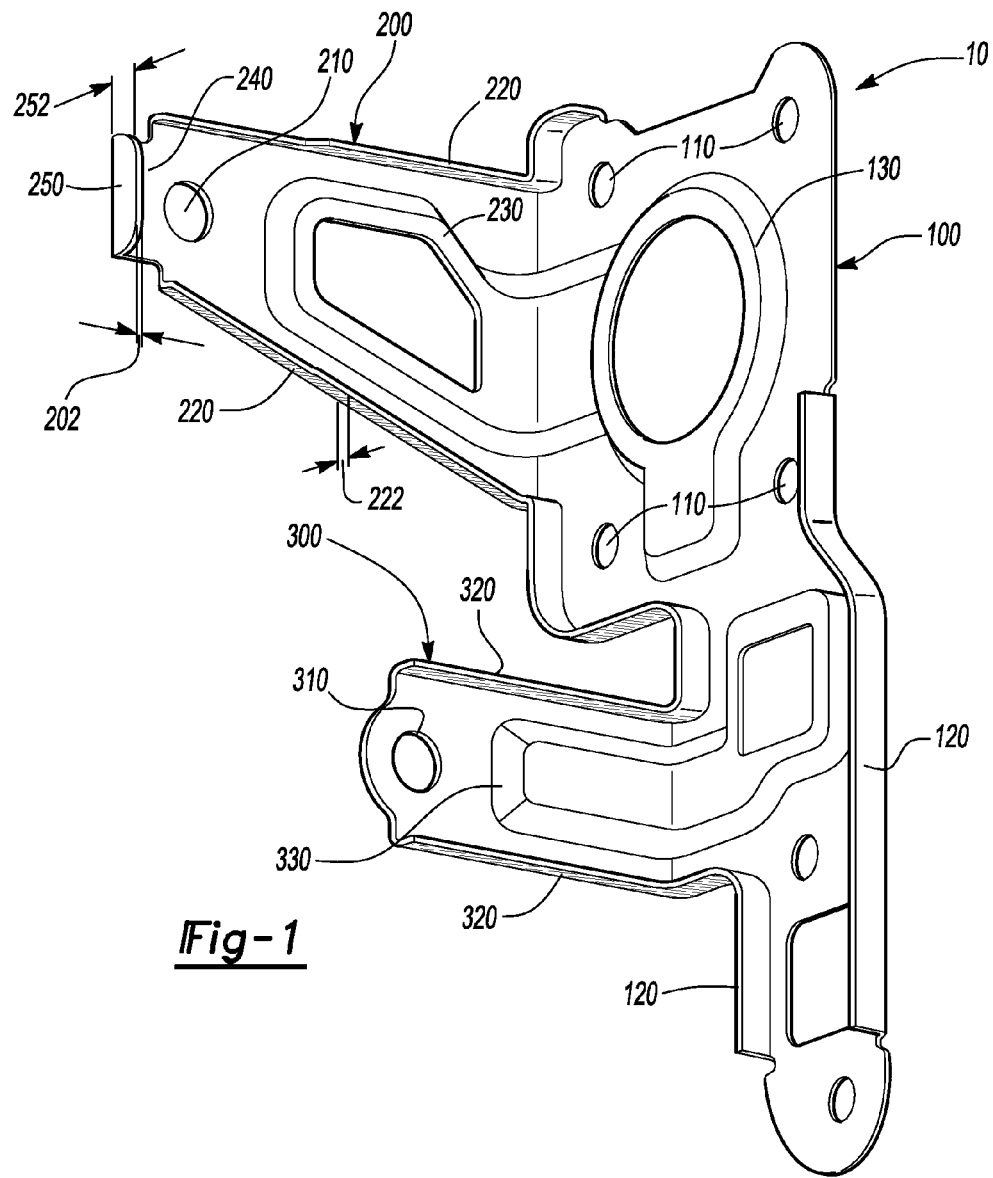
FIG. 1 is a perspective view of a generally L-shaped bracket according to an embodiment of the present invention.

The present invention discloses a mounting system for temporarily mounting a device proximate to a panel while an individual works on the device before the device is mounted to the panel. As such, the present invention has utility for assisting in the assembly of a machine.

The mounting system can include a panel having a key hole with a catch slot extending therefrom, the key hole having a width and the catch slot having a width less than the key hole width. In some instances, the catch slot extends in a downwardly direction from the key hole. A generally L-shaped bracket having a first portion and a second portion extending from the first portion can also be included.

The second portion of the generally L-shaped bracket is dimensioned to fit within the catch slot and has a distal end that is spaced apart from the first portion. A catch tab can extend from the distal end at an angle and be dimensioned to pass through the key hole but not to pass through the catch slot of the panel. A device may or may not be included and can be attached to the first portion and/or second portion of the generally L-shaped bracket. The catch tab of the generally L-shaped bracket can engage a front side of the catch slot and temporarily hold the device proximate to the panel when the catch tab is passed through the key hole and the second portion is lowered into the catch slot. In some instances, the device can be an electronic device that is temporarily held proximate to the panel while electrical wiring is attached thereto before the device is mounted to the panel.

The panel can have an anti-pivot rib that extends from a generally vertical edge of the catch slot in a rearwardly direction. For the purposes of the present invention, rearwardly direction is defined as the direction starting at the panel and moving towards an individual viewing a display surface or display screen of the device after it has been rigidly mounted to the panel. The anti-pivot rib can contact the second portion that is located within the catch slot and prevent the generally L-shaped bracket from pivoting beyond a predetermined angle when the second portion is located within the catch slot. In some instances the panel can have two anti-pivot ribs that extend in the rearwardly direction from opposing generally vertical edges of the catch slot. In this manner, the two anti-pivot ribs can contact the second portion that is within the catch slot and prevent the generally L-shaped bracket from pivoting beyond the predetermined angle. In addition, the second portion can have a lower reinforcement flange that extends at an angle from the second portion along a bottom edge thereof. The reinforcement flange can stiffen the second portion and contact the one or two anti-pivot ribs, thereby reducing the predetermined angle that the generally L-shaped bracket can pivot.

A process for installing a device into the panel is also disclosed with the process including providing the device and the generally L-shaped bracket, the device optionally having at least one connection through which a component can be connected to the device. The device can be attached to the first portion and/or second portion of the L-shaped bracket and can be placed proximate to the front side of the panel. Thereafter, the catch tab is passed through the key hole of the panel and the second portion is lowered into the catch slot such that the catch tab engages the front side of the catch slot. The engagement of the catch tab with the front side of the catch slot prevents the catch tab from passing back through the key hole and thereby temporarily mounts the device to the panel proximate the opening through which it will be mounted. A component can then be connected to the device, for example by passing electrical wiring, tubing and the like through the opening and connecting it to the device.

After the component has been connected to the device, the second portion of the generally L-shaped bracket can be raised out of the catch slot and the catch tab pulled back through the key hole. The L-shaped bracket and the attached device no longer being temporarily mounted to the panel, the device can then be placed at least partially through the opening and rigidly attached thereto.

Turning now to FIG. 1, a generally L-shaped bracket according to an embodiment of the present invention is shown at reference numeral 10. The bracket 10 can include a first portion 100 and a second portion 200 extending from the first portion 100. The first portion 100 can have one or more apertures 110 that afford for attachment of a device to the bracket 10 and/or reduce the weight of the bracket. The first portion can also have one or more reinforcement flanges 120 that can increase the rigidity, stiffness and the like of the bracket 10. In addition, one or more contours 130 can be included that also increase the stiffness, strength and the like of the bracket 10 and may or may not be complementary with contours of a device to be attached to the first portion 100 and thereby ensure proper placement and/or alignment of the bracket 10 relative to the device.

The second portion 200 can have one or more apertures 210 that afford for the bracket 10 to be rigidly attached to the panel. In addition, aperture(s) 210 can reduce the weight of the bracket 10. The second portion 200 can also have one or more reinforcement flanges 220 that extend therefrom a predetermined length 222 and provide stiffness to the bracket 10. A contour 230 can be included and, similar to the contour 130, can provide stiffness to the second portion 200. The second portion 200 has a distal end 240 that is spaced apart from the first portion 100. Extending from the distal end 240 at an angle is a catch tab 250, the catch tab 250 having a length 252. In addition, the distal end 240 and/or the second portion 200 can have a thickness 202.

In some instances, the generally L-shaped bracket 10 can have a third portion, fourth portion, etc. extending from the first portion 100. For example, a third portion 300 can extend from the first portion 100 as illustrated in FIG. 1, the third portion 300 having one or more apertures 310, reinforcement flanges 320 and contours 330. It is appreciated that the shape of the generally L-shaped bracket 10 as illustrated in the figures is for illustrative purposes only and that other shaped brackets are included within the scope of the present disclosure.

Figure 2:
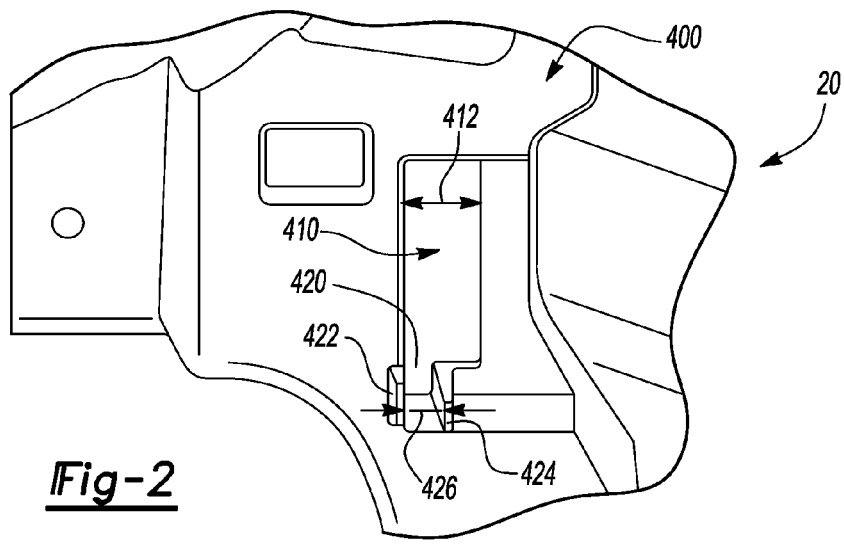
FIG. 2 is a front perspective view of a panel having a key hole with a catch slot according to an embodiment of the present invention.

Turning now to FIG. 2, a perspective view of a back side of a key hole portion of a panel is shown generally at reference numeral 20. The panel 20 can have a back side 400, the panel also having a key hole 410 with a catch slot 420 extending therefrom. The key hole 410 has a width 412 and the catch slot 420 has a width 426. In some instances, the catch slot 420 can have an anti-pivot rib 422 that extends in a rearwardly direction from a generally vertical edge of the catch slot 420. In addition, the catch slot 420 can have a pair of anti-pivot ribs 422 and 424 that extend rearwardly from opposing vertical edges of the catch slot 420.

Figure 3:
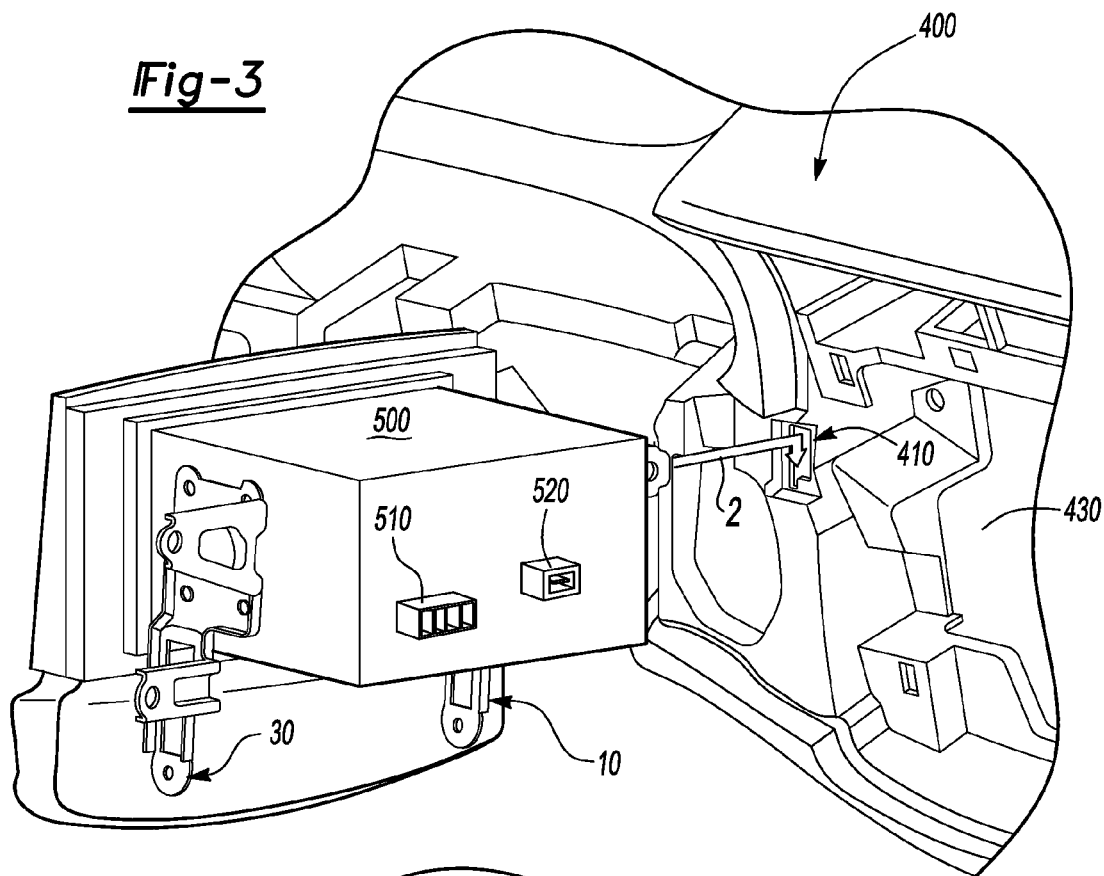
FIG. 3 is a perspective view of a device attached to the generally L-shaped bracket shown in FIG. 1, the device located proximate to the panel.
Figure 4:
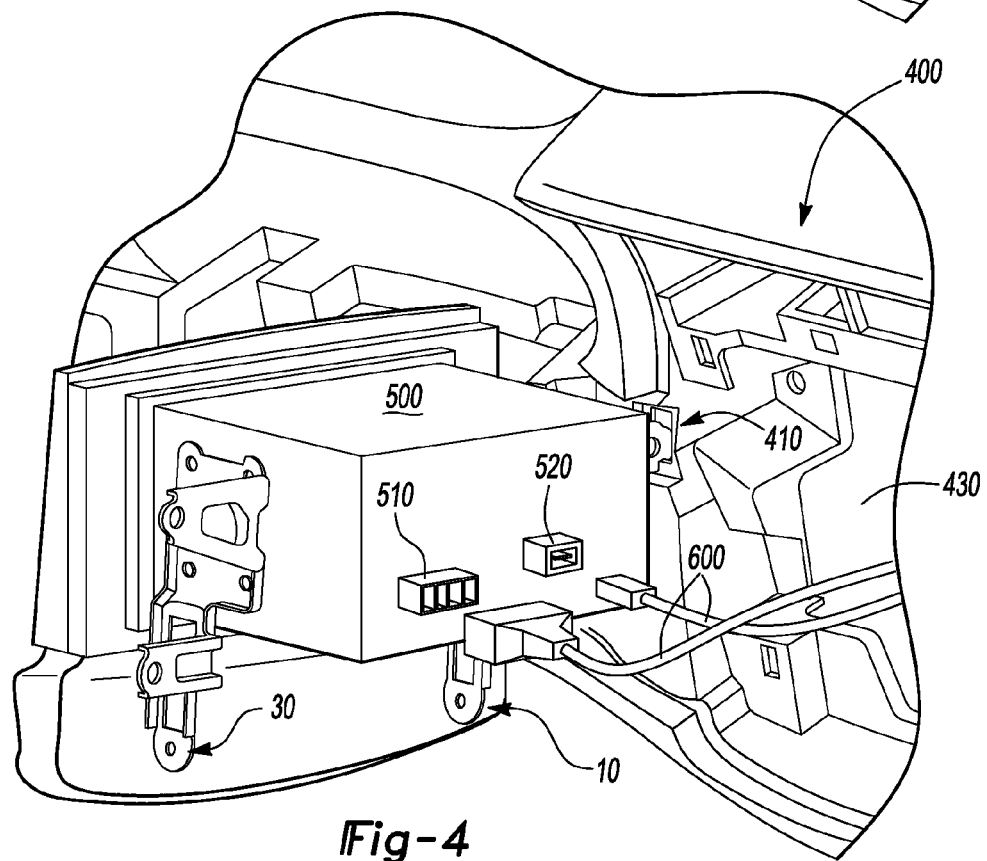
FIG. 4 is a perspective view of the device shown in FIG. 3 temporarily mounted to the panel while a component is connected thereto.

Turning now to FIGS. 3 and 4, a device 500 can be attached to the generally L-shaped bracket 10. In some instances, a pair of generally L-shaped brackets can be attached to the device 500, for example the bracket 10 and an additional generally L-shaped bracket 30. It is appreciated that the generally L-shaped bracket 30 may or may not have a catch tab.

The device 500 can have one or more connections 510, 520, etc. that can be used to connect a component to the device before it is rigidly mounted to the panel 20. As illustrated in FIG. 4 for illustrative purposes only, electrical wiring 600 can be passed through a device opening and be used to connect the component to the device using connectors 510 and 520. It is appreciated that the device 500 can be an electronic device, a mechanical device and combinations thereof. For example and for illustrative purposes only, the device 500 can be a radio, CD player, GPS and/or navigation device, interior climate control for a motor vehicle, engine gauges and the like.

Figure 5:
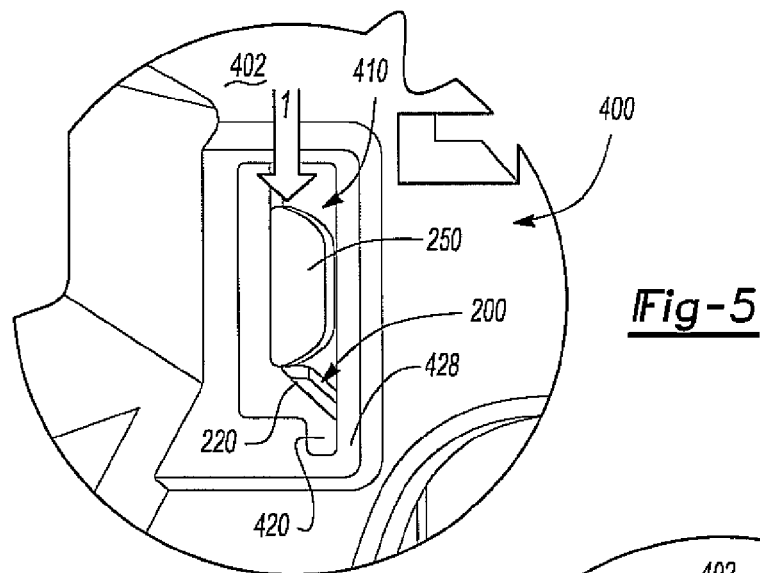
FIG. 5 is a perspective view of a front side of the panel shown in FIG. 2.
Figure 6:
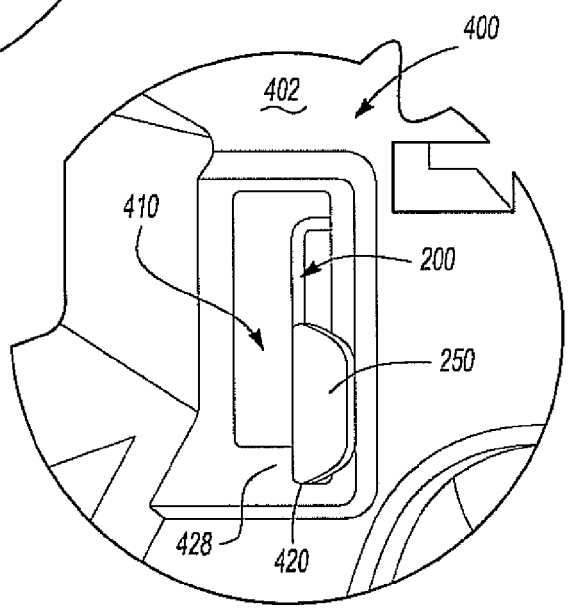
FIG. 6 is a perspective view illustrating a catch tab of the generally L-shaped bracket shown in FIG. 1 engaging a front side of the catch slot shown in FIG. 5.

Turning to FIGS. 5 and 6, an alternate view of the panel 20 is shown. In particular, FIG. 5 illustrates a front side 402 of the panel 20 with the catch tab 250 passing through the key hole 410 from the front side in a forward direction. As shown by the arrow 1, after the catch tab 250 has passed through the key hole 410, the second portion 200 can be lowered into the catch slot 420. In addition, after the second portion 200 has been lowered into the catch slot 420 the catch tab 250 can engage a front side 428 of the catch slot 420. Stated differently, the length 252 of the catch slot 420 is less than the width 412 of the key hole 410 but is greater than the width 426 of the catch slot 420. As such, the catch tab 250 can pass through the key hole 410 but cannot pass through the catch slot 420. In addition, the thickness 202 of the distal end 240 and/or the second portion 200 is less than the width 426 of the catch slot 420. Therefore, the distal end 240 and/or the second portion 200 can fit within the catch slot 420 and place the catch tab 250 directly adjacent to the front side 402 of the catch slot 420.

It is appreciated that when the device 500 is temporarily mounted to the panel 20 as illustrated in FIG. 4, it can be more easily worked on by an individual. For example and for illustrative purposes only, in assembly line operations where limited time and space can be available for an individual to connect a device to a machine and thereafter mount it to a panel, such a mounting system provides temporary mounting of the device and can assist the individual in connecting the device with or to one or more components. It is appreciated that the component can be connected to the device using electrical wiring, a pneumatic air lines, a hydraulic fluid line, a mechanical connection and the like. In addition, it is further appreciated that for the purposes of the present invention, the component can be the electrical wiring itself, the pneumatic air line, hydraulic fluid line, mechanical connection, etc.

The process for mounting the device 500 to the panel 20 can include providing the device 500 and attaching the device to the generally L-shaped bracket 10. In addition, the second generally L-shaped bracket 30 can also be attached to the device 500. Thereafter, the device 500 can be placed proximate to the panel 20 and the catch tab 250 passed through the key hole 410 by moving the catch tab 250 in a generally forward direction as shown by arrow 2 in FIG. 3. After the catch tab has passed through the key hole 410, the distal end 240 and/or second portion 200 can be lowered into the catch slot 420 and the catch tab 250 allowed to engage the front side 428 of the catch slot 420 as illustrated in FIG. 6. It is appreciated that a portion of the bracket 10 and/or device 500 can rest against the panel at a location below the keyhole 410, after the catch tab 250 has engaged the front side 428 of the catch slot 410, and thus provide at least two points of contact between the device 500 and/or bracket 10 and the panel 20 while it is temporarily mounted thereto.

Figure 7:
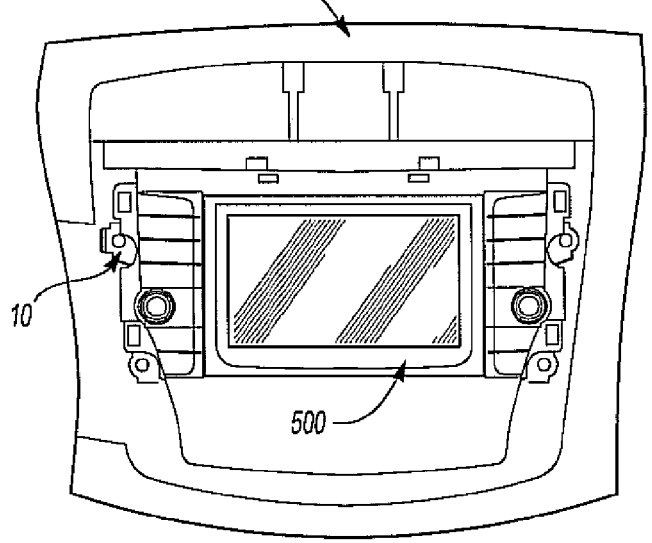
FIG. 7 is a schematic illustration of the device shown in FIGS. 3 and 4 mounted to the panel.

One or more components can be connected to the device 500, for example using the electrical wiring 600 and the connections 510 and 520. Thereafter, the catch tab 250 can be removed from the key hole 410 by lifting the device 500 and/or second portion 200 such that the catch tab 250 is no longer directly in front of the catch slot 420, and moving the catch tab 250 back through the key hole 410 in a rearwardly direction. The device 500 can then be attached to the panel 20 by inserting the device 500 at least partially through the opening 430 as illustrated in FIG. 7. It is appreciated that the generally L-shaped bracket 10 and/or the generally L-shaped bracket 30 can be attached to the panel and/or other fixture elements of the machine using threaded fasteners, welding, adhesives, hook and loop fasteners, tape and the like. In this manner, a process is provided for temporarily mounting a device to a panel so that an individual can work on the device before it is rigidly attached thereto.

The foregoing drawings, discussion and description are illustrative of specific embodiments of the present invention, but are they are not meant to be limitations upon the practice thereof. The generally L-shaped bracket, the panel and the like can be made from any material known to those skilled in the art, illustratively including metals, plastics, ceramics and the like. Numerous modifications and variations of the invention will be readily apparent to those of skill in the art in view of the teaching presented herein. It is the following claims, including all equivalents, which define the scope of the invention.

We claim:

1. A mounting system for temporarily holding a device proximate to a panel while an individual works on the device and before the device is mounted to the panel, said mounting system comprising:
   a generally L-shaped bracket having a first portion and a second portion extending from said first portion, said second portion having a distal end spaced apart from said first portion, said distal end having a predetermined thickness;
   a catch tab extending from said distal end at an angle, said catch tab having a length;
   a panel having a front face and a key hole with a catch slot, said key hole having a width and said catch slot having a width less than said key hole width;
   said distal end thickness less than said catch slot, said catch tab length less than said key hole width and greater than said catch slot width;
   wherein said catch tab engages a front side of said catch slot and temporarily holds the device proximate the panel when the device is attached to said first portion of said L-shaped bracket and said catch tab is passed through said key hole and said distal end is lowered into said catch slot.

2. The mounting system of claim 1, wherein said panel has an anti-pivot rib extending from a generally vertical edge of said catch slot in a rearwardly direction, said anti-pivot rib contacting said distal end and preventing said generally L-shaped bracket from pivoting beyond a predetermined angle when said distal end is lowered into said catch slot.

3. The mounting system of claim 1, wherein said panel has two anti-pivot ribs extending in a rearwardly direction from opposing generally vertical edges of said catch slot, said two anti-pivot ribs contacting said distal end second portion located within said catch slot and preventing said generally L-shaped bracket from pivoting beyond a predetermined angle when said distal end is lowered into said catch slot.

4. The mounting system of claim 3, wherein said second portion has a lower reinforcement flange extending along a bottom edge, said lower reinforcement flange stiffening said second portion and contacting said two anti-pivot ribs and reducing said predetermined angle said generally L-shaped bracket can pivot when said distal end is lowered into said catch slot.

5. The mounting system of claim 4, wherein said second portion has an upper reinforcement flange extending along a top edge thereof, said upper reinforcement flange stiffening said second portion.

6. The mounting system of claim 1, wherein said panel is an instrumentation panel for a machine.

7. The mounting system of claim 1, wherein said panel is an instrumentation panel for a motor vehicle.

8. The mounting system of claim 1, further comprising an electronic device attached to said first portion of said generally L-shaped bracket, wherein said electronic device is temporarily held proximate said panel while electric wiring is attached to said electronic device.

9. A mounting system for temporarily holding a device proximate to a panel while an individual works on the device and before the device is mounted to the panel, said mounting system comprising:
a panel having a front face and a key hole with a catch slot, said key hole having a width and said catch slot having a width less than said hey hole width;
a generally L-shaped bracket having a first portion and a second portion extending from said first portion, said second portion dimensioned to fit within said catch slot and having a distal end spaced apart from said first portion;
a catch tab extending from said distal end at an angle, said catch tab dimensioned to pass through said key hole but not to pass through said catch slot;
a device attached to said first portion of said generally L-shaped bracket;
wherein said catch tab engages a front side of said catch slot and temporarily holds said device proximate said panel when said catch tab is passed through said key hole and said distal end is lowered into said catch slot.

10. The mounting system of claim 9, wherein said device is an electronic device that is temporarily held proximate said panel while electrical wiring is attached to said electronic device before said electronic device is mounted to said panel.

11. A process for installing a device into a panel of a machine, the process comprising:
providing a device having at least one connection;
providing a component to be connected to the device;
providing a generally L-shaped bracket made from a first portion and a second portion extending from the first portion, the first portion attached to the electronic device and the second portion having a distal end spaced apart from the first portion, the distal end having a catch tab extending at an angle therefrom;
providing a panel having an opening dimensioned for the device and the L-shaped bracket to fit at least partially therethrough, the panel also having a keyhole with a catch slot proximate the opening;
the second portion of the generally L-shaped bracket dimensioned to fit within the catch slot and the catch tab dimensioned to pass through the key hole but not to pass through the catch slot;
placing the device with the attached generally L-shaped bracket at a position proximate the opening;
passing the catch tab through the keyhole;
lowering the second portion into the catch slot wherein the catch tab engages a front side of the catch slot and temporarily mounts for the device to the panel proximate the opening;
passing the component at least partially through the opening of the panel;
connecting the component to the device while it is temporarily mounted to the panel;
raising the second portion of the generally L-shaped bracket out of the catch slot;
passing the catch tab back through the key hole such that the device is no longer temporarily mounted to the panel;
placing the device at least partially through the opening of the panel; and
rigidly attaching the second portion to the generally L-shaped bracket to the panel such that the device is rigidly attached to the panel of the machine.

12. The process of claim 11, wherein the device is an electronic device and the component is wiring.

13. The process of claim 11, wherein the panel has an anti-pivot rib extending from a generally vertical edge of the catch slot in a rearwardly direction, the anti-pivot rib contacting the second portion and preventing the generally L-shaped bracket from pivoting beyond a predetermined angle when the second portion is lowered into the catch slot.

14. The process of claim 11, wherein the panel has two anti-pivot ribs extending in a rearwardly direction from opposing generally vertical edges of the catch slot, the two anti-pivot ribs contacting the second portion located within the catch slot and preventing the generally L-shaped bracket from pivoting beyond a predetermined angle when the second portion is lowered into the catch slot.

15. The process of claim 14, wherein the second portion has a reinforcement flange extending along a bottom edge thereof, the reinforcement flange stiffening the second portion and contacting the two anti-pivot ribs and reducing the predetermined angle the generally L-shaped bracket can pivot when the second portion is lowered into the catch slot.

16. The process of claim 15, wherein the second portion has an upper reinforcement flange extending along a top edge thereof, the upper reinforcement flange stiffening the second portion.

* * * * *

UNITED STATES PATENT AND TRADEMARK OFFICE
CERTIFICATE OF CORRECTION

| | | |
|---|---|---|
| PATENT NO. | : 8,113,472 B2 | Page 1 of 1 |
| APPLICATION NO. | : 12/424424 | |
| DATED | : February 14, 2012 | |
| INVENTOR(S) | : Erik Anthony Wippler et al. | |

It is certified that error appears in the above-identified patent and that said Letters Patent is hereby corrected as shown below:

Column 5, line number 49, delete "keyhole", insert --key hole--.

Column 7, line number 11, delete "hey", insert --key--.

Column 7, line number 42, delete "keyhole", insert --key hole--.

Column 8, line number 3, delete "keyhole", insert --key hole--.

In the Claims:

Column 8, claim number 5, line number 6, after mounted, delete "fur".

Column 8, claim number 15, line number 40, after angle insert --such that--.

Signed and Sealed this
Fourteenth Day of August, 2012

David J. Kappos
*Director of the United States Patent and Trademark Office*